(12) United States Patent
Jung et al.

(10) Patent No.: US 11,374,161 B2
(45) Date of Patent: Jun. 28, 2022

(54) ACTUATOR AND SOFT ROBOT

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Won Jong Jung, Seoul (KR); Ho Young Kim, Seoul (KR); Kak Namkoong, Seoul (KR); Yeol Ho Lee, Anyang-si (KR); Myoung Hoon Jung, Bucheon-si (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 334 days.

(21) Appl. No.: 16/115,717

(22) Filed: Aug. 29, 2018

(65) Prior Publication Data
US 2019/0296217 A1 Sep. 26, 2019

(30) Foreign Application Priority Data
Mar. 21, 2018 (KR) .................. 10-2018-0032942

(51) Int. Cl.
| | | |
|---|---|---|
| *B25J 9/00* | (2006.01) |
| *H01L 41/09* | (2006.01) |
| *B25J 9/16* | (2006.01) |
| *B25J 9/14* | (2006.01) |
| *B25J 17/00* | (2006.01) |
| *B25J 9/12* | (2006.01) |
| *F15B 15/14* | (2006.01) |
| *B25J 13/06* | (2006.01) |
| *F15B 15/08* | (2006.01) |

(52) U.S. Cl.
CPC .............. *H01L 41/092* (2013.01); *B25J 9/12* (2013.01); *B25J 9/142* (2013.01); *B25J 9/161* (2013.01); *B25J 17/00* (2013.01); *B25J 13/06* (2013.01); *F15B 15/088* (2013.01); *F15B 15/149* (2013.01)

(58) Field of Classification Search
CPC ......... H01L 41/092; B25J 9/161; B25J 9/142; B25J 17/00; B25J 9/12; B25J 13/06; B25J 13/087; B25J 9/0012; B25J 9/06; F15B 15/149; F15B 15/088
See application file for complete search history.

(56) References Cited

U.S. PATENT DOCUMENTS

| | | |
|---|---|---|
| 8,439,908 B2 | 5/2013 | Utley et al. |
| 9,713,873 B2 | 7/2017 | Cheng et al. |
| 2009/0012513 A1 | 1/2009 | Utley et al. |

(Continued)

FOREIGN PATENT DOCUMENTS

| | | |
|---|---|---|
| JP | 2010-532702 A | 10/2010 |
| JP | 2012-249388 A | 12/2012 |

*Primary Examiner* — Ian Jen
(74) *Attorney, Agent, or Firm* — Sughrue Mion, PLLC

(57) ABSTRACT

An actuator according to an aspect of the present invention includes: a driving body including a plurality of conductive grains, a chamber configured to confine the plurality of conductive grains, and two or more electrodes disposed on a surface of the chamber; and a controller configured to obtain, through the two or more electrodes, a change in an electric signal, in response to a load applied to the chamber, and to adjust the load applied to the chamber based on the change in the electric signal.

18 Claims, 7 Drawing Sheets

(56) References Cited

U.S. PATENT DOCUMENTS

| | | | |
|---|---|---|---|
| 2009/0133508 A1* | 5/2009 | Johansson | G01L 5/228 73/862.046 |
| 2013/0106127 A1 | 5/2013 | Lipson et al. | |
| 2013/0226173 A1 | 8/2013 | Utley et al. | |
| 2014/0109560 A1* | 4/2014 | Ilievski | B25J 9/1075 60/484 |
| 2016/0016319 A1 | 1/2016 | Remirez et al. | |
| 2016/0311108 A1 | 10/2016 | Alambeigi et al. | |

* cited by examiner

N = 30
Ared fraction ~ 0.7 → ΔFraction = 0.08
Contact number = 47
Short path = 5a

ACTUATOR AND SOFT ROBOT

CROSS-REFERENCE TO RELATED APPLICATION

This application claims priority from Korean Patent Application No. 10-2018-0032942, filed on Mar. 21, 2018, in the Korean Intellectual Property Office, the entire disclosure of which is incorporated herein by reference for all purposes.

BACKGROUND

1. Field

One or more exemplary embodiments relate generally to an actuator and a soft robot, and more particularly to an actuator and a soft robot which may be precisely controlled by using a feedback signal.

2. Description of the Related Art

Generally, robots are made of hard components or materials, such that it is difficult to change a shape or compliance according to the purpose of use or circumstances.

For this reason, in order to ensure precise movements of robots, a greater number of connecting portions of each joint and control devices are required, which increases complexity and limits an increase in the degree of freedom of operating the robots.

As a solution to such a problem, the technology of soft robotics made of soft materials is in the spotlight and research thereon is actively conducted. Soft materials have variable shapes and are lightweight, such that soft robots have great advantages in terms of stability, wearability, versatility, and the like, and are receiving attention as a future robotics technology.

Accordingly, there is active research to apply such soft robotics to biomimetic robots, wearable robots, medical robots, and robots for home services and factories. In the soft robots utilizing the granular jamming phenomenon, the rigidity (or compliance) of an actuator may be easily changed, thereby minimizing the number of components and control devices. Specifically, in the granular jamming phenomenon, as a volume fraction (or density of a medium) of the grains is increased, viscosity of the medium including the grains is rapidly increased, such that physical properties may be easily changed by using the granular jamming phenomenon.

SUMMARY

According to an aspect of an exemplary embodiment, provided is an actuator including a driving body including a plurality of conductive grains, a chamber configured to confine the plurality of conductive grains, and two or more electrodes disposed on a surface of the chamber; and a controller configured to obtain, through the two or more electrodes, a change in an electric signal, in response to a load applied to the chamber, and to adjust the load applied to the chamber based on the change in the electric signal.

The change in the electric signal may be based on a change of a resistance in an electrical path provided by the plurality of conductive grains in the chamber.

The controller may estimate a load applied to a respective part of the chamber by sequentially or selectively activating the two or more electrodes, and by obtaining the change in the electric signal between the activated electrodes.

The controller may adjust the load applied to the chamber by estimating a changed shape of the chamber based on the estimated load applied to the respective part of the chamber.

The plurality of conductive grains may include at least one from among a metal, a semiconductor, graphene, a nanoscale composite, and a composite of two or more conductive materials.

The plurality of conductive grains may have at least one from among a spherical shape, an oval shape, and a polyhedral shape.

The electric signal may be based on at least one from among a current, a voltage, resistance, impedance, and admittance.

The at least a part the chamber may include a flexible material.

Chamber may have at least one from among a spherical shape, an oval shape, a polyhedral shape, and a shape bent in a predetermined direction.

The actuator may further include a driving source configured to apply the load to the chamber.

The driving source may apply the load to the plurality of conductive grains in the chamber by using at least one from among pneumatic pressure, magnetism, and a motor.

According to an aspect of another exemplary embodiment, there is provided a soft robot, including: two or more driving bodies, a driving body of the two or more driving bodies including: a plurality of conductive grains; a chamber confining the plurality of conductive grains; and two or more electrodes disposed inside or outside of the chamber; and a connector; a driving source configured to apply a load to the chamber; and two or more controllers configured to obtain, through the two or more electrodes, obtain a change in an electric signal, in response to the load applied to the chamber, and to adjust the load applied to the chamber based on the change in the electric signal.

The change in the electric signal may be based on a change of a resistance in an electrical path provided by the plurality of conductive grains in the chamber.

The two or more controllers may estimate a load applied to a respective part of the chamber by sequentially or selectively activating the two or more electrodes, and by obtaining the change in the electric signal between the activated electrodes.

The two or more controllers may adjust the load applied to the chamber by estimating a changed shape of the chamber based on the estimated load applied to the respective part of the chamber.

The two or more controllers may independently control the two or more driving bodies.

Adjacent driving bodies of the two or more driving bodies may be connected in series or in parallel with each other through the connector.

The plurality of conductive grains have different shapes according to positions of the two or more driving bodies.

At least a part of the chamber may include flexible material.

The chamber may have a different shape and flexibility according to positions of the two or more driving bodies.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION

Figure 1:
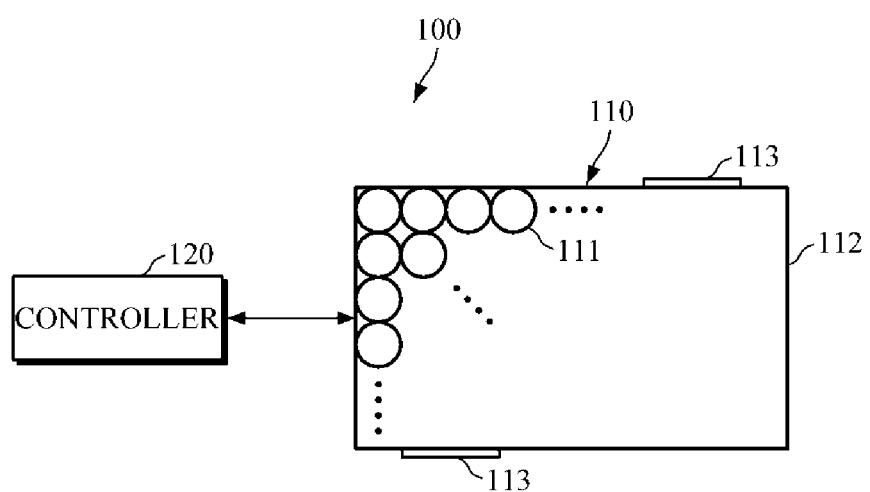
FIG. 1 is a block diagram illustrating an example of an actuator according to an exemplary embodiment.

Hereinafter, embodiments of the present disclosure will be described in detail with reference to the accompanying drawings. It should be noted that, in the drawings, the same reference symbols refer to same parts although illustrated in other drawings. Throughout the drawings and the detailed description, unless otherwise described, the same drawing reference numerals will be understood to refer to the same elements, features, and structures. The relative size and depiction of these elements may be exaggerated for clarity, illustration, and convenience. In the following description, a detailed description of known functions and configurations incorporated herein will be omitted when it may obscure the subject matter of the disclosure.

Process steps described herein may be performed differently from a specified order, unless a specified order is clearly stated in the context of the disclosure. That is, each step may be performed in a specified order, at substantially the same time, or in a reverse order.

Further, the terms used throughout this specification are defined in consideration of the functions according to exemplary embodiments, and can be varied according to a purpose of a user or manager, or precedent and so on. Therefore, definitions of the terms should be made on the basis of the overall context.

Any references to singular may include plural unless expressly stated otherwise. In the specification, it should be understood that the terms, such as 'including' or 'having,' etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, exemplary embodiments of an actuator and a soft robot will be described in detail with reference to the accompanying drawings.

FIG. 1 is a block diagram illustrating an example of an actuator according to an exemplary embodiment.

Referring to FIG. 1, an actuator 100 includes a driving body 110 and a controller 120. Further, the driving body 110 includes a plurality of conductive grains 111, a chamber 112 which confines the conductive grains 111, and two or more electrodes 113 which are disposed on a surface of the chamber 112.

The driving body 110 may accept a load imposed by pressure of a fluid (e.g., air, oil, etc.) filled in the chamber 112 or by physical pressure applied from the outside of the chamber 112, and may drive the actuator 100 according to an external shape of the chamber 112 and/or a change in physical properties of a medium (e.g., aggregation of the conductive grains 111, etc.).

The conductive grains 111 may be grains having electric conductivity, and may be filled in the chamber 112. Examples of the conductive grains 111 may include a material having electric conductivity, such as metal, a semiconductor, graphene, a nanoscale composite, and the like; or a composite (e.g., metal-semiconductor alloy) of two or more materials having electric conductivity. However, the conductive grains 111 are not limited thereto, and may include all types of materials having electric conductivity.

Further, the conductive grains 111 may be formed in one of a spherical shape, an oval shape, and a polyhedral shape. However, the shape of the conductive grains 111 is not limited thereto, and may have various shapes according to the purpose of use of the actuator 100.

For example, in order to adjust the number of contacts between the conductive grains 111 in the chamber 112, the conductive grains 111 having different shapes may be combined, or the conductive grains 111 having the same shape may be provided in different sizes.

In another example, the conductive grains 111 may have one or more protrusions on the surface. For example, in the case where the conductive grains 111 have a spherical shape, the conductive grains 111 may have one or more protrusions having a linear shape, a cylindrical shape, or a conical shape, which protrude externally from the surface of the conductive grains 111.

As described above, by providing a combination of the conductive grains 111 having different sizes and shapes, or the conductive grains 111 having one or more protrusions formed on the surface, the number of conducts between the conductive grains 111 may be readily changed. For example, the conductive grains 111 may be combined with different sizes or shapes, so that the volume structure of the conductive grains 111 included in the chamber 112 may have various shapes. In this manner, an area fraction and the contact number of the conductive grains 111 may be adjusted, thereby controlling sensitivity of a feedback signal and adjusting driving characteristics of the driving body 110 more precisely, which will be described later.

Here, the contacts between the conductive grains 111 may provide an electrical path which will be described later. An increased number of contacts leads to an increase in the electrical path, which may result in reduction in electrical resistance of the chamber 112. For example, by controlling the formation of the electrical path by adjusting the number of contacts of the conductive grains 111, sensitivity of an electric signal change by the load applied to the chamber 112 may be adjusted.

All or part of the chamber 112 may include a flexible material, or each part of the chamber 112 may include different materials having various degrees of rigidity, so as to confine the conductive grains 111.

For example, in the case where all or part of the chamber 112 includes a flexible material, the flexible material may have elasticity or stretchiness. For example, in the case where all or part of the chamber 112 includes a flexible material, when a load is applied to the chamber 112, the conductive grains 111 in the chamber 112 are rearranged such that a shape of a flexible portion of the chamber 112 may be changed. In this case, the driving body 110 may be driven with directivity by contraction or expansion of the flexible portion of the chamber 112.

Further, the conductive grains 111 may have a shape which may impart directivity to a change in the shape of the chamber 112. For example, in the case where the conductive grains 111 have an oval shape with a radius of a horizontal axis being longer than a radius of a vertical one, when a load is applied to the chamber 112, the conductive grains 111 in the chamber 112 are rearranged such that a shape of the chamber 112 may be changed with directivity in a horizontal axis direction.

The chamber 112 may have at least one of a spherical shape, an oval shape, a polyhedral shape, and a shape bent in a predetermined direction. However, the shape of the chamber 112 is not limited thereto, and the chamber 112 may have an asymmetrical shape, or may have different shapes according to a direction desired for driving.

Two or more electrodes 113 are disposed on a surface of the chamber 112 to form an electrical path with the conductive grains 111 in the chamber 112.

For example, the electrodes 113 may be spaced apart from each other by a predetermined distance on the surface of the chamber 112, and may connect the inside and the outside of the chamber 112 by penetrating the chamber 112, to come into contact with the conductive grains 111 within the chamber 112.

Further, the actuator 100 may include a driving source which applies a load to the driving body 110. For example, the driving source may apply a load to the chamber 112 by using pneumatic pressure, magnetism, electromagnetism, or a motor.

For example, the driving source may apply a load by contracting or expanding the chamber 112 by using pressure of a fluid acting on the chamber 112, or may directly apply physical pressure to the inside or outside of the chamber 112. The driving source applies the load to the chamber 112 for the purpose of inducing jamming phenomenon of the conductive grains 111 included in the chamber 112 by using pressure applied to the chamber 112; and it can be understood that the load is applied to the conductive grains 111 in the chamber 112.

The controller 120 may measure a change in an electric signal, which is caused by the load applied to the chamber 112, through the electrodes 113, and may adjust the load applied to the chamber 112 by using the measured electric signal as a feedback signal. The controller 120 may include, for example, a microprocessor, a central processing unit (CPU), or an integrated circuit for executing programmable instructions.

For example, when a load is applied to the chamber 112, rigidity and compliance of the driving body 110 may be easily changed by the jamming phenomenon of the grains in the chamber 112; and by adjusting the load applied to the chamber 112 by using the feedback signal, the controller 120 may precisely drive the driving body 110.

For example, when a load is applied to the chamber 112, the conductive grains 111 in the chamber 112 are rearranged such that the rigidity of the driving body 110 may be changed. In this case, a contact state between the conductive grains 111 is changed due to the rearrangement of the conductive grains 111, thereby leading to a change in an electrical path. Here, the change in the electrical path may include a change in the length of an electrical path or a change in the number of electrical paths, which is caused by the change in a contact state between the conductive grains 111 due to the rearrangement of the conductive grains 111. When a load is applied to the chamber 112, the electrical path is changed, e.g., the length of the electrical path becomes shorter, as well as the number of the electrical path increases, such that resistance is significantly reduced. In other words, when a load is applied to the chamber 112, a linear density of the electrical path may increase.

In this case, the controller 120 may measure a change in the electrical signal, which is caused by the rearrangement of the conductive grains 111 in the chamber 112, through the electrodes 113 and may accurately estimate and adjust the load, applied to the chamber 112, by using the electric signal as a feedback signal.

That is, the conductive grains 111 in the chamber 112 may form an electrical path by contacting each other; and the controller 120 may detect an electric signal, e.g., one of a current, a voltage, resistance, impedance, and admittance, which are transmitted through the formed electrical path.

Hereinafter, a change in the electric signal, which is caused by the load applied to the chamber 112, will be described in detail with reference to FIGS. 2A and 2B.

Figure 2A:
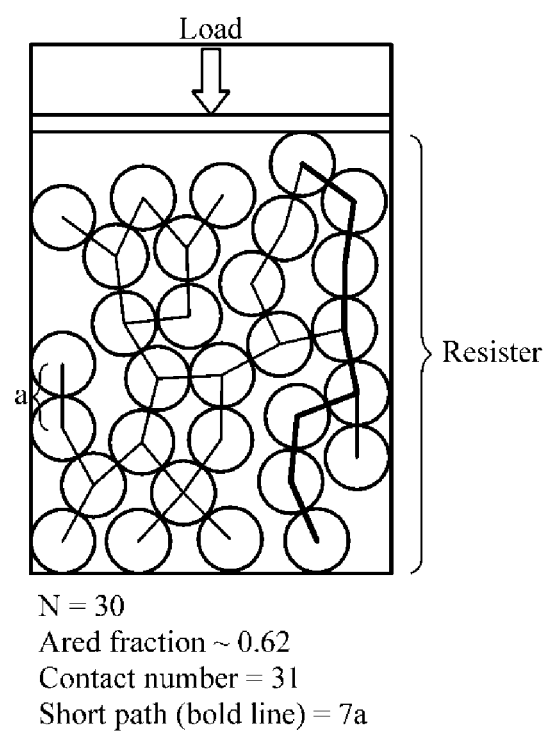
FIGS. 2A and 2B are exemplary diagrams explaining an example of changing an electrical path in a chamber when a load is applied to the chamber in an actuator according to an exemplary embodiment.
Figure 2B:
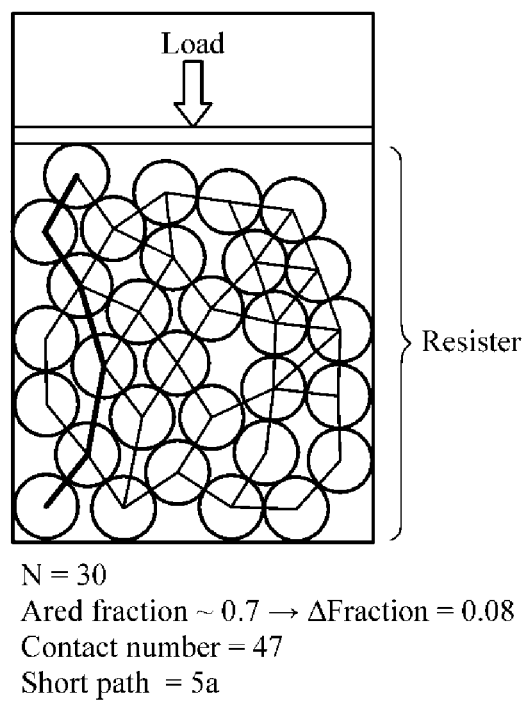

FIGS. 2A and 2B are exemplary diagrams explaining an example of changing an electrical path in the chamber 112 when a load is applied to the chamber 112.

Referring to FIGS. 1 and 2A, a balance of force is maintained while grains in the chamber 112 contact each other. In this case, a force network formed by the contacts between the grains may be referred to as a force chain.

Here, a reference numeral "a" denotes a center-to-center distance between one grain and another grain contacting the grain, and a reference numeral N denotes the number of grains included in the chamber 112.

Referring to FIG. 2A, an area fraction before pressure is applied to the chamber 112 is 0.62, the contact number is 31, and a shortest path through the force chain between both ends of the chamber 112 is 7a.

Further, referring to FIG. 2B, an area fraction after pressure is applied to the chamber 112 and the grains are rearranged is 0.7, the contact number is 47, and a shortest path through the force chain between both ends of the chamber 112 is 5a.

As described above, as a load is applied to the chamber 112, the area fraction and the number of contacts between the grains are increased, and the shortest path between both ends of the chamber 112 is reduced.

That is, as a load is applied to the chamber 112, a balance of force between the grains included in the chamber 112 is broken, and the grains are rearranged such that the number of the force chains is increased, indicating that the area fraction is increased (0.08) and the number of contacts between the grains is increased.

In this case, based on the grains included in the chamber 112 being conductive materials, the force chain formed by the grains may serve as an electrical path; and as described above, it can be understood that the increase in the force chain due to the load applied to the chamber 112 may lead to the increase in the electrical path.

For example, a change in resistance due to the load applied to the chamber 112 may be calculated by the following Equation 1.

$$R = \rho \frac{l}{A} \qquad \text{[Equation 1]}$$

Here. R denotes resistance, p denotes specific resistance, A denotes a cross-sectional area, and l denotes a length. That is, the resistance is proportional to the specific resistance and the length of a material, and is inversely proportional to the cross-sectional area of a material.

When a load is applied to the chamber 112, jamming of the conductive grains 111 included in the chamber 112 occurs such that the number of contacts between the conductive grains 111 is increased, and an electrical path in the conductive medium is increased, which on the whole produces a result equivalent to reduction in the resistance of an aggregation of the conductive grains 111, i.e., the conductive medium.

The controller 120 may measure the load actually applied to the chamber 112 by measuring a change in an electric signal, which is caused by the jamming of the conductive grains 111 in the chamber 112, through the electrodes disposed on the surface of the chamber 112, and may precisely adjust the load applied to the chamber 112 by using the electric signal as a feedback signal.

For example, based on an estimation model which is pre-generated based on a correlation between a load applied to the chamber 112 and a change in an electric signal due to the load, the controller 120 may estimate a load applied to the chamber 112 from a measured electric signal, and may adjust the load applied to the chamber 112 by using the estimated load as a feedback signal.

Figure 3:
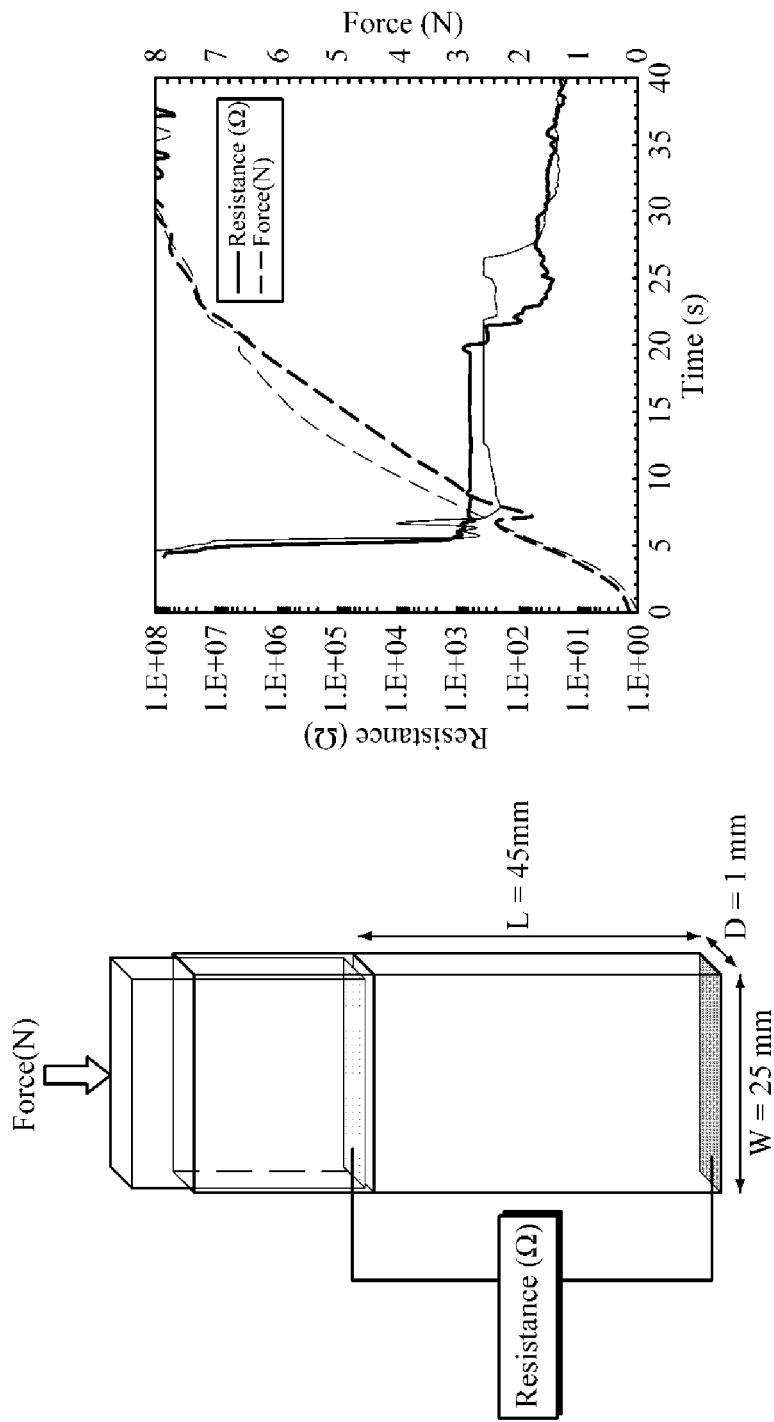
FIG. 3 is an exemplary diagram illustrating a change in resistance according to a change in pressure applied to a chamber in an actuator according to an exemplary embodiment.

FIG. 3 is an exemplary diagram illustrating a change in resistance according to a change in pressure applied to a chamber according to an exemplary embodiment.

FIG. 3 illustrates an example of providing, on both ends of the chamber 112, the electrodes 113 for measuring a change in an electric signal of a conductive medium including the conductive grains 111, and measuring a change in resistance on both ends of the chamber 112 when a load is applied to the chamber 112.

Further, a graph of FIG. 3 shows a force (N) applied to both ends of the chamber 112 with lapse of time(s), and a change in resistance (f) according to a change in force.

Referring to FIG. 3, it can be seen that as pressure is applied to both ends of the chamber 112, resistance on both ends of the chamber 112 has a tendency to decrease. This indicates that when a load is applied to both ends of the chamber 112, a force chain is changed by the jamming of the grains in the chamber 112, leading to a change in an electrical path of the conductive grains 111, and as a result, resistance measured on both ends of the chamber 112 is decreased with the increase in pressure applied to the chamber 112.

As described above, when a load is applied to a conductive medium including the conductive grains 111, the measured resistance is decreased by the jamming of the grains. Accordingly, the controller 120 may measure the load applied to the chamber 112 by measuring an electric signal in the chamber 112 through the electrodes 113 disposed on the surface of the chamber 112; and based on the measurement, the controller 120 may precisely adjust the load applied to the chamber 112.

In this case, the estimation model may be pre-generated for each driving body according to the purpose of use and intention of operation of the actuator 100. However, the estimation model is not limited thereto, and may be directly generated by continuously updating a learning model through an operation process of the actuator 100 using a neural network.

Figure 4A:
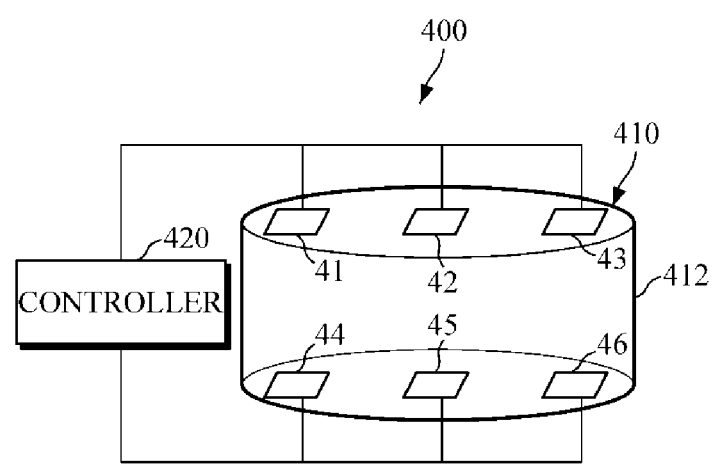
FIGS. 4A and 4B are exemplary diagrams illustrating a case where a plurality of electrodes are disposed on a chamber of a driving body in an actuator according to an exemplary embodiment.
Figure 4B:
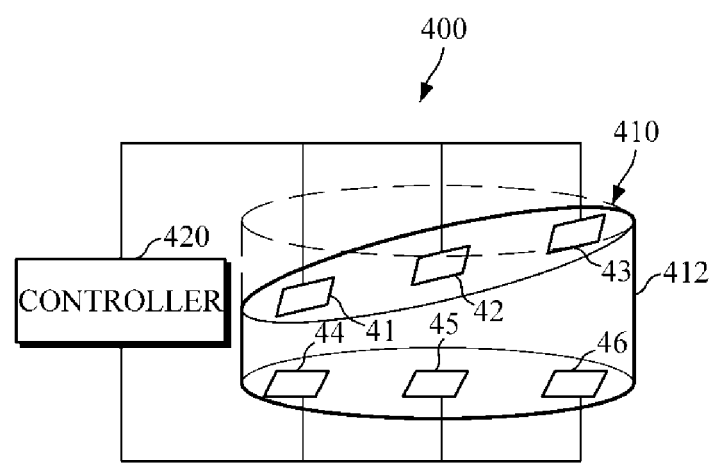

FIGS. 4A and 4B are exemplary diagrams illustrating a case where a plurality of electrodes are disposed on a chamber of a driving body.

Referring to FIGS. 1, 4A, and 4B, a plurality of electrodes 41, 42, 43, 44, 45, and 46 are disposed on the surface of a chamber 412.

In this case, a controller 420 may estimate a load applied to each portion of the chamber 412 by sequentially or selectively activating the plurality of electrodes disposed on the chamber 412. The controller 420 may include, for example, a microprocessor, a central processing unit (CPU), or an integrated circuit for executing programmable instructions.

For example, by sequentially or selectively activating at least two or more of the plurality of electrodes 41, 42, 43, 44, 45, and 46 connected to the chamber 412, the controller 420 may measure a change in an electric signal between the electrodes; and by using the electric signal as a feedback signal, the controller 420 may adjust the load applied to the chamber 412.

Referring to FIG. 4A, by sequentially or selectively activating at least two or more of the plurality of electrodes before a load is applied to the chamber 412, the controller 420 may apply a voltage through the activated electrodes; and may calculate resistance of an electrical path formed between the activated electrodes by measuring a current at the electrodes.

In this case, the controller 420 may determine the applied voltage, the measured current, and the calculated resistance value to be an electric signal value in an inactive state of the driving body 410.

Further, referring to FIG. 4B, by sequentially or selectively activating at least two or more of the plurality of electrodes after a load is applied to the chamber 412, the controller 420 may apply a voltage through the activated electrodes, and may calculate resistance of an electrical path formed between the activated electrodes by measuring a current at the electrodes.

The controller 420 may determine the applied voltage, the measured current, and the calculated resistance value to be an electric signal value in an active state of the driving body 410; and the controller 420 may calculate a variation in the electric signal by comparing the electric signal value in the inactive state of the driving body 410 with the electric signal value in the active state of the driving body 410.

Referring to FIG. 4B, it can be seen that after a load is applied to the chamber 412, a distance from the electrode 41 to the electrodes 44, 45, and 46 becomes shorter as compared to FIG. 4A.

For example, the controller 420 may measure the change in the electric signal after a load is applied, by activating sequentially only the electrodes 41 and 44, only the electrodes 41 and 45, and then only the electrodes 41 and 46.

In this case, based on a result that the measured change in the electric signal between the electrode 41 and the electrode 44 is greater than the measured change in the electric signal between the electrode 41 and the electrode 46, the controller 420 may determine that the load applied between the electrode 41 and the electrode 44 is greater than the load applied between the electrode 41 and the electrode 46.

Accordingly, the controller 420 may control a driving source to adjust a degree of load applied to the position of each electrode.

Further, based on the measured change in the electric signal, the controller 420 may estimate a changed shape of the chamber 412.

For example, referring to FIGS. 4A and 4B, based on a result that the variation in an electrical signal measured between the electrode 41 and the electrode 44 is greater than the variation in an electrical signal measured between the electrode 41 and the electrode 46 as described above, the controller 420 may determine that the load applied between the electrode 41 and the electrode 44 is greater than the load applied between the electrode 41 and the electrode 46.

In this case, based on a determination result that the load applied between the electrode 41 and the electrode 44 is greater than the load applied between the electrode 41 and the electrode 46, the controller 420 may determine that a degree of change between the electrode 41 and the electrode 44 is greater than a degree of change between the electrode 41 and the electrode 46.

As described above, the controller 420 may estimate the load applied to each portion of the chamber 412 based on the change in the electric signal measured through the plurality of electrodes, and may control the driving body 410 more precisely by controlling the driving source based on the estimation. In addition, the controller 420 may precisely adjust an operational state of the actuator 100 by estimating a changed shape of the chamber 412 based on the estimated load.

Figure 5:
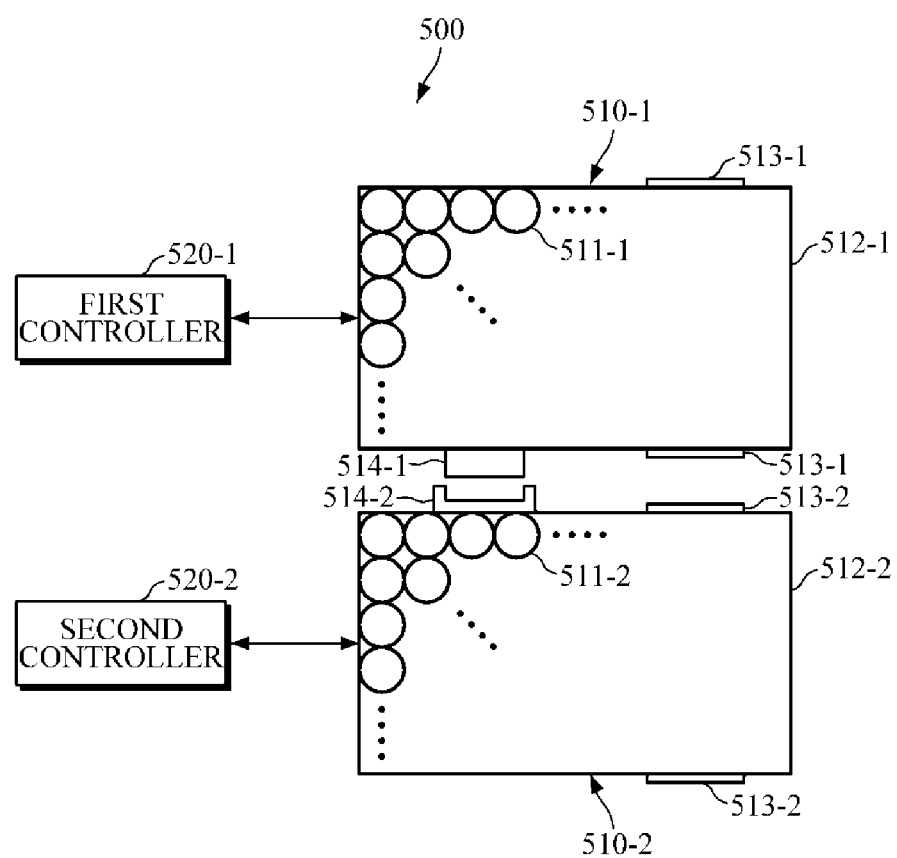
FIG. 5 is a block diagram illustrating an example of a soft robot according to an exemplary embodiment.

FIG. 5 is a block diagram illustrating an example of a soft robot according to an exemplary embodiment.

Referring to FIG. 5, a soft robot 500 includes two or more driving bodies 510-1 and 510-2, a driving source which applies a load to chambers 512-1 and 512-2, and two or more controllers 520-1 and 520-2. For convenience of explanation, FIG. 5 illustrates two driving bodies 510-1 and 510-2 and two controllers 520-1 and 520-2, but is not intended to be limiting.

The two or more driving bodies 510-1 and 510-2 include a plurality of conductive grains 511-1 and 511-2, the chambers 512-1 and 512-2 which confine the conductive grains 511-1 and 511-2, two or more electrodes 513-1 and 513-2 disposed on the surface of the chambers 512-1 and 512-2, and connectors 514-1 and 514-2.

The two or more controllers 520-1 and 520-2 may measure a change in an electric signal, which is caused by a load applied to the chambers 512-1 and 512-2, through the electrodes 513-1 and 513-2, and may adjust the load applied to the chambers 512-1 and 512-2 by using the electric signal as a feedback signal. The two or more controllers 520-1 and 520-2 may include, for example, a microprocessor, a central processing unit (CPU), or an integrated circuit for executing programmable instructions.

Here, the first driving body 510-1 and the second driving body 510-2, which include the plurality of conductive grains 511-1 and 511-2, the chambers 512-1 and 512-2 confining the conductive grains 511-1 and 511-2, and the two or more electrodes 513-1 and 513-2 disposed on the surface of the chambers 512-1 and 512-2, are the same or similar to the driving body 110, and the conductive grains 111, the chamber 112, and the electrodes 113 which are included in the driving body 110 described above with reference to FIG. 1. Further, the first controller 520-1 and the second controller 520-2, which measure the change in the electric signal due to the load applied to the chambers 512-1 and 512-2 and adjust the load applied to the chambers 512-1 and 512-2 by using the electric signal as a feedback signal, may perform the same or similar functions of those of the controller 120 described above with reference to FIG. 1.

Hereinafter, in order to avoid overlapping explanation, description will be made in detail below based on details that are not described above with reference to FIGS. 1 to 4B.

The first controller 520-1 and the second controller 520-2 may adjust a load applied to the chambers 512-1 and 512-2 by using, as a feedback signal, a change in an electric signal which is caused by a resistance change that occurs due to a change in an electrical path formed by the plurality of conductive grains 511-1 and 511-2 in the chambers 512-1 and 512-2.

For example, when the load is applied to the chambers 512-1 and 512-2, the conductive grains 511-1 and 511-2 in the chambers 512-1 and 512-2 are rearranged, such that rigidity of the first driving body 510-1 and the second driving body 510-2 may be changed. In this case, a change in a contact state between the conductive grains 511-1 and 511-2 due to the rearrangement of the conductive grains 511-1 and 511-2 may lead to a change in an electrical path.

In this case, the first controller 520-1 and the second controller 520-2 may measure the change in the electric signal, which is caused by the rearrangement of the conductive grains 511-1 and 511-2 in the chambers 512-1 and 512-2, through the electrodes 513-1 and 513-2, and may precisely estimate and adjust the load applied to the chambers 512-1 and 512-2 by using the electric signal as a feedback signal.

Further, the first controller 520-1 and the second controller 520-2 may estimate the load applied to each portion of the chambers 512-1 and 512-2 by sequentially or selectively activating the plurality of electrodes 513-1 and 513-2 and by measuring the change in the electric signal between the activated electrodes.

For example, by sequentially or selectively activating at least two or more of the plurality of electrodes 513-1 and 513-2 after a load is applied to the chambers 512-1 and 512-2, the first controller 520-1 and the second controller 520-2 may apply a voltage through the activated electrodes, and may calculate resistance of an electrical path formed between the activated electrodes by measuring a current at the electrodes.

In this case, the first controller 520-1 and the second controller 520-2 may determine the applied voltage, the measured current, and the calculated resistance value to be an electric signal value in an active state of the first driving body 510-1 and the second driving body 510-2; and the first controller 520-1 and the second controller 520-2 may calculate a variation in the electric signal by comparing the electric signal value in the inactive state of the first driving body 510-1 and the second driving body 510-2 with the electric signal value in the active state of the first driving body 510-1 and the second driving body 510-2.

As described above, by selectively controlling the plurality of electrodes 513-1 and 513-2, the first controller 520-1 and the second controller 520-2 may measure the change in the electric signal between the activated electrodes, and may measure a load applied to portions where the activated electrodes are disposed.

In this case, based on an estimation model which is pre-generated based on a correlation between the load applied to the chambers 512-1 and 512-2 and the change in the electric signal due to the load, the first controller 520-1 and the second controller 520-2 may estimate the load applied to the chamber 512-1 and 512-2 from the measured electric signal.

In this case, the estimation model may be pre-generated individually for each of the first driving body 510-1 and the second driving body 510-2 according to the purpose of use and intention of operation of the soft robot 500. However, the estimation model is not limited thereto, and may be directly or indirectly generated by continuously updating a learning model through an operation process of the soft robot 500 using a neural network.

The first controller 520-1 and the second controller 520-2 may estimate a load applied to each portion of the chambers 512-1 and 512-2 through the plurality of electrodes 513-1 and 513-2; and may estimate shapes of the chambers 512-1 and 512-2 based on the load applied to each portion of the chambers 512-1 and 512-2.

For example, the first controller 520-1 and the second controller 520-2 may determine that a greater load, estimated for each portion of the chambers 512-1 and 512-2, results in a greater degree of change of the chambers 512-1 and 512-2; and based on the determination, the first controller 520-1 and the second controller 520-2 may adjust the load applied to the chambers 512-1 and 512-2 of the first driving body 510-1 and the second driving body 510-2, thereby controlling movement of the soft robot 500 more precisely.

The first driving body 510-1 and the second driving body 510-2 may be interconnected through the connectors 514-1 and 514-2.

For example, in the case where the connector 514-1 protrudes at one side of the chamber of the first driving body 510-1, and the connector 514-2, having a groove for connection with the protruding connector 514-1, is at one side of the chamber of the second driving body 510-2, when the connector 514-1 is inserted into the connector 514-2, the first driving body 510-1 and the second driving body 510-2 may be connected to each other.

However, this is merely exemplary, and the first driving body 510-1 and the second driving body 510-2 may be connected by using various connection methods, such as insertion-coupling, contact connection, and detachable connection; and the connection method is not limited thereto.

Further, the first controller 520-1 and the second controller 520-2 are connected to the first driving body 510-1 and the second driving body 510-2, respectively, to independently control the first driving body 510-1 and the second driving body 510-2.

For example, regardless of driving of the second driving body 510-2, the first controller 520-1 may independently control the first driving body 510-1 by using a driving state of the first driving body 510-1, e.g., a measured electric signal, as a feedback signal.

In another example, the first controller 520-1 and the second controller 520-2 may share, through wired or wireless communication, driving states of the first driving body 510-1 and the second driving body 520-2, i.e., the change in the measured electric signal, and may jointly control the driving states of the first driving body 510-1 and the second driving body 520-2. For example, in the case where the first driving body 510-1 and the second driving body 510-2 are driven at the same time, the first controller 520-1 and the second controller 520-2 may share driving states of the first driving body 510-1 and the second driving body 510-2, and may adjust the loads applied to the first driving body 510-1 and the second driving body 510-2 according to the driving states of the first driving body 510-1 and the second driving body 510-2.

For example, in the case where the first driving body 510-1 and the second driving body 510-2 are connected to each other to perform a specific operation, even when the first controller 520-1 and the second controller 520-2 apply predetermined loads to the first driving body 510-1 and the second driving body 510-2, loads actually applied to the first driving body 510-1 and the second driving body 510-2 may be different according to driving characteristics in a state where the first driving body 510-1 and the second driving body 510-2 are connected to each other; and by sharing the loads applied to the first driving body 510-1 and the second driving body 510-2, the first controller 520-1 and the second controller 520-2 may jointly control the first driving body 510-1 and the second driving body 510-2 to control the operation of the soft robot 500.

In this case, the first controller 520-1 and the second controller 520-2 may be independent elements which are differentiated in terms of hardware and/or software, but the controllers are not limited thereto, and a single controller may control jointly driving bodies.

The first driving body 510-1 and the second driving body 510-2 may be connected in series and/or in parallel with other adjacent driving body, and the first driving body 510-1 and the second driving body 510-2 may be a group of a plurality of driving bodies which are connected in series and/or in parallel.

All or part of the chambers 512-1 and 512-2 of the first driving body 510-1 and the second driving body 510-2 may include a flexible material, and each part of the chambers 512-1 and 512-2 may be made of different materials having various degrees of rigidity. In the case where all or part of the chambers 512-1 and 512-2 include a flexible material, the flexible material may have elasticity or stretchiness.

For example, in the case where all or part of the chambers 512-1 and 512-2 include a flexible material, when a load is applied to the chambers 512-1 and 512-2, the conductive grains 511-1 and 511-2 in the chambers 512-1 and 512-2 are rearranged such that a shape of the chambers 512-1 and 512-2 may be changed. In this case, the chambers 512-1 and 512-2 may have directivity by contraction or expansion of the flexible portion.

For example, the chambers 512-1 and 512-2 may have different shapes and flexibility according to positions of the first driving body 510-1 and the second driving body 510-2. In the case where the first driving body 510-1 or the second driving body 510-2 is positioned at a bent portion, the chambers 512-1 and 512-2 may have higher flexibility than a case where the first driving body 510-1 or the second driving body 510-2 is not positioned at the bent portion; and each part of the chambers 512-1 and 512-2 may have different flexibility according to a bent direction.

Further, the conductive grains 511-1 and 511-2 may have different shapes according to positions of the first driving body 510-1 and the second driving body 510-2.

For example, the conductive grains 511-1 and 511-2 may have a shape which may impart directivity to a change in the shape of the chambers 512-1 and 512-2. For example, in the case where the conductive grains 511-1 and 511-2 have an oval shape with a radius of a horizontal axis being longer than a radius of a vertical one, when a load is applied to the chambers 512-1 and 512-2, the conductive grains 511-1 and 511-2 having an oval shape are rearranged such that a shape of the chambers 512-1 and 512-2 may be changed with directivity in a horizontal axis direction. Further, in the case where the first driving body 510-1 or the second driving body 510-2 is positioned at a bent portion, the conductive grains 511-1 or 511-2 may have a bent oval shape.

As described above, by using the first driving body 510-1 and the second driving body 510-2 which may be connected to each other, the chambers 512-1 and 512-2 having different shapes and rigidity according to the positions of the first driving body 510-1 and the second driving body 510-2, and the conductive grains 511-1 and 511-2 having various shapes, precise movement of the soft robot 500 may be ensured.

The above-described embodiments may be used in various applications, including wearable robots (e.g., Exosuit. Exoglove, etc.), biomimetic robots, medical robots, a tactile user interface, and the like, but the application is not limited thereto. For example, the tactile user interface may include one or more driving bodies and controllers described in the above embodiments. In this case, the one or more driving bodies including conductive grains may be formed to function as a resistive touch panel. For example, when an external stimulus is applied to the driving bodies, the arrangement of the conductive grains in the driving bodies is changed such that an electric signal is changed by the change of the arrangement of the conductive grains. Such change of the electric signal may be input to a controller, and the controller may obtain tactile information by receiving the change in the electric signal as an input, and may perform an operation corresponding to the obtained tactile information. However, the controller according to exemplary embodiments is not limited thereto.

At least one of the components, elements, modules or units described herein may be embodied as various numbers of hardware, software and/or firmware structures that execute respective functions described above, according to an exemplary embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing operations may employ any number of related art techniques for electronics configuration, signal processing and/or control, data processing and the like.

The disclosure has been described herein with regard to preferred embodiments. However, it will be obvious to those skilled in the art that various modifications can be made without departing from the gist of the invention. Therefore, it is to be understood that that the scope of the invention is not limited to the above-mentioned embodiments, but is intended to include various modifications and equivalents included within the spirit and scope of the appended claims.

What is claimed is:

1. An actuator, comprising:
a driving body comprising:
a plurality of conductive grains comprising at least one from among a metal, a semiconductor, graphene, and a nanoscale composite, the plurality of conductive grains having a spherical shape;
a chamber configured to confine the plurality of conductive grains; and
two or more electrodes disposed on an outer surface of the chamber, the plurality of conductive grains being provided between the two or more electrodes,
wherein a load is applied to the chamber so that the chamber rearranges the plurality of conductive grains to change an electrical path between the plurality of conductive grains and the two or more electrodes; and
a central processing unit (CPU) configured to:
obtain, through the two or more electrodes, a change in an electric signal corresponding to the changed electrical path between the rearranged plurality of conductive grains and the two or more electrodes; and
adjust the load applied to the chamber, based on the obtained change in the electric signal.

2. The actuator of claim 1, wherein the change in the electric signal is based on a change of a resistance in the changed electrical path between the rearranged plurality of conductive grains in the chamber.

3. The actuator of claim 1, wherein the CPU is configured to estimate a load that is applied to a respective part of the chamber by sequentially or selectively activating electrodes among the two or more electrodes, and by obtaining the change in the electric signal between the activated electrodes.

4. The actuator of claim 3, wherein the CPU is configured to adjust the load applied to the chamber by estimating a changed shape of the chamber based on the estimated load applied to the respective part of the chamber.

5. The actuator of claim 1, wherein the electric signal is based on at least one from among a current, a voltage, resistance, impedance, and admittance.

6. The actuator of claim 1, wherein at least a part the chamber comprises a flexible material.

7. The actuator of claim 1, wherein the chamber has at least one from among a spherical shape, an oval shape, a polyhedral shape, and a shape bent in a predetermined direction.

8. The actuator of claim 1, further comprising a driving source configured to apply the load to the chamber.

9. The actuator of claim 8, wherein the driving source is configured to apply the load to the plurality of conductive grains in the chamber by using at least one from among pneumatic pressure, magnetism, and a motor.

10. A soft robot, comprising:
two or more driving bodies, a driving body of the two or more driving bodies comprising:
a plurality of conductive grains comprising at least one from among a metal, a semiconductor, graphene, and a nanoscale composite, the plurality of conductive grains having a spherical shape,
a chamber confining the plurality of conductive grains,
two or more electrodes disposed inside or outside of the chamber; and
a connector;
a driving source configured to apply a load to the chamber so that the chamber rearranges the plurality of conductive grains to change an electrical path between the plurality of conductive grains and the two or more electrodes; and
two or more central processing units (CPUs) configured to:
obtain, through the two or more electrodes, a change in an electric signal corresponding to the changed electrical path between the rearranged plurality of conductive grains and the two or more electrodes; and adjust the load applied to the chamber, based on the obtained change in the electric signal.

11. The soft robot of claim 10, wherein the change in the electric signal is based on a change of a resistance in the changed electrical path between the rearranged plurality of conductive grains in the chamber.

12. The soft robot of claim 10, wherein the two or more CPUs are configured to estimate a load that is applied to a respective part of the chamber by sequentially or selectively activating electrodes among the two or more electrodes, and by obtaining the change in the electric signal between the activated electrodes.

13. The soft robot of claim 12, wherein the two or more CPUs are configured to adjust the load applied to the chamber by estimating a changed shape of the chamber based on the estimated load applied to the respective part of the chamber.

14. The soft robot of claim 10, wherein the two or more CPUs are configured to independently control the two or more driving bodies.

15. The soft robot of claim 10, wherein adjacent driving bodies of the two or more driving bodies are connected in series or in parallel with each other through the connector.

16. The soft robot of claim 10, wherein the plurality of conductive grains have different shapes according to positions of the two or more driving bodies.

17. The soft robot of claim 10, wherein at least a part of the chamber comprises flexible material.

18. The soft robot of claim 17, wherein the chamber has a different shape and flexibility according to positions of the two or more driving bodies.

* * * * *